(12) United States Patent
Schillinger et al.

(10) Patent No.: US 9,832,892 B2
(45) Date of Patent: Nov. 28, 2017

(54) SENSOR FOR OUTPUTTING AN ELECTRIC SIGNAL ON THE BASIS OF A DETECTED PHYSICAL VARIABLE

(71) Applicant: Continental Teves AG & Co. oHG, Frankfurt (DE)

(72) Inventors: Jakob Schillinger, Gaimersheim (DE); Dietmar Huber, Rödermark (DE); Lothar Biebricher, Oberusel (DE); Manfred Goll, Glauberg (DE); Marco Benner, Biedenkopf-Wallau (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days.

(21) Appl. No.: 14/648,782

(22) PCT Filed: Nov. 29, 2013

(86) PCT No.: PCT/EP2013/075186
§ 371 (c)(1),
(2) Date: Jun. 1, 2015

(87) PCT Pub. No.: WO2014/095314
PCT Pub. Date: Jun. 26, 2014

(65) Prior Publication Data
US 2015/0316584 A1   Nov. 5, 2015

(30) Foreign Application Priority Data
Dec. 20, 2012   (DE) .................. 10 2012 224 102

(51) Int. Cl.
*G01R 33/02* (2006.01)
*H05K 5/00* (2006.01)
(Continued)

(52) U.S. Cl.
CPC .......... *H05K 5/0034* (2013.01); *G01D 11/245* (2013.01); *G01D 18/00* (2013.01);
(Continued)

(58) Field of Classification Search
CPC ...... G01R 33/09; G01R 33/093; G01R 33/07; H01L 2224/48247
(Continued)

(56) References Cited

U.S. PATENT DOCUMENTS

| 4,957,876 A | 9/1990 | Shibata |
| 5,386,730 A | 2/1995 | Ikeda |

(Continued)

FOREIGN PATENT DOCUMENTS

| CN | 101960933 | 1/2011 |
| CN | 102171016 | 8/2011 |

(Continued)

OTHER PUBLICATIONS

German Search Report for German Application No. 10 2013 224 652.8 dated Dec. 8, 2014, including partial translation.
(Continued)

*Primary Examiner* — Giovanni Astacio-Oquendo
(74) *Attorney, Agent, or Firm* — RatnerPrestia

(57) ABSTRACT

A sensor for outputting an electrical signal on the basis of a detected physical variable, including: a measuring circuit accommodated in a circuit housing and capable of contacting an external circuit by an electric signal connection; and a protective body consisting of a protective compound with an opening, the compound surrounding the circuit housing and the opening exposing part of the circuit housing. The surface of the circuit housing has a moulded element which is surrounded by the protective compound.

8 Claims, 4 Drawing Sheets

(51) Int. Cl.
*G01R 1/04* (2006.01)
*G01R 33/09* (2006.01)
*G01D 11/24* (2006.01)
*G01D 18/00* (2006.01)
*H05K 3/28* (2006.01)
*H01L 23/544* (2006.01)
*H05K 1/02* (2006.01)
*H05K 5/06* (2006.01)

(52) U.S. Cl.
CPC ............... *G01R 1/04* (2013.01); *G01R 33/09* (2013.01); *H01L 23/544* (2013.01); *H05K 1/0266* (2013.01); *H05K 3/284* (2013.01); *H05K 5/003* (2013.01); *H05K 5/0017* (2013.01); *H05K 5/062* (2013.01); *H01L 2223/54433* (2013.01); *H01L 2223/54486* (2013.01); *H01L 2224/48091* (2013.01); *H01L 2224/48137* (2013.01); *H01L 2924/1461* (2013.01); *Y10T 29/49004* (2015.01); *Y10T 29/49147* (2015.01)

(58) Field of Classification Search
USPC .......................................... 324/252, 200, 244
See application file for complete search history.

(56) References Cited

U.S. PATENT DOCUMENTS

| | | | |
|---|---|---|---|
| 5,948,991 A | 9/1999 | Nomura | |
| 5,963,028 A | 10/1999 | Engel | |
| 6,784,528 B2* | 8/2004 | Nakanishi | H01L 23/49838 257/686 |
| 6,991,475 B2 | 1/2006 | Dreyer | |
| 7,473,845 B2 | 1/2009 | Berchtold | |
| 7,830,135 B2 | 11/2010 | Worones | |
| 8,411,455 B2 | 4/2013 | Kondo | |
| 8,742,563 B2* | 6/2014 | Meyer | H01L 23/49816 257/276 |
| 8,820,160 B2 | 9/2014 | Doering | |
| 8,993,895 B2 | 3/2015 | Koshimizu | |
| 9,640,467 B2* | 5/2017 | Schillinger | H01L 23/49541 |
| 2002/0170897 A1 | 11/2002 | Hall | |
| 2004/0051211 A1* | 3/2004 | Mastro | B29C 41/08 264/438 |
| 2006/0049548 A1* | 3/2006 | Auburger | B29C 45/14655 264/400 |
| 2007/0175754 A1* | 8/2007 | Toguchi | G01N 27/4077 204/424 |
| 2008/0290482 A1* | 11/2008 | Bayan | H01L 21/568 257/670 |
| 2009/0065882 A1* | 3/2009 | Shirasaka | H04R 19/005 257/415 |
| 2011/0296904 A1* | 12/2011 | Tagawa | G01F 1/684 73/114.32 |
| 2012/0176866 A1* | 7/2012 | Urase | G10K 11/004 367/140 |
| 2012/0206888 A1* | 8/2012 | Schillinger | G01D 11/245 361/760 |

FOREIGN PATENT DOCUMENTS

| | | |
|---|---|---|
| CN | 102845139 | 12/2012 |
| DE | 4321068 | 1/1994 |
| DE | 4237870 | 3/1994 |
| DE | 20017105 | 1/2001 |
| DE | 10207762 | 9/2003 |
| DE | 10300175 | 7/2004 |
| DE | 10313832 | 10/2004 |
| DE | 102006032998 | 1/2008 |
| DE | 102006042556 | 3/2008 |
| DE | 102008036823 | 2/2009 |
| DE | 102008043773 | 5/2010 |
| DE | 19758891 | 2/2012 |
| DE | 102011004144 | 8/2012 |
| DE | 102012201018 | 7/2013 |
| DE | 102012203222 | 9/2013 |
| DE | 202012003728 | 9/2013 |
| JP | 0191498 | 4/1989 |
| JP | 04268789 | 9/1992 |
| JP | 11109009 | 4/1999 |
| JP | 2005011978 | 1/2005 |
| WO | 2010037810 | 4/2010 |
| WO | 2011043488 | 4/2011 |

OTHER PUBLICATIONS

International Search Report for International Application No. PCT/EP2013/075186 dated May 9, 2014.
Chinese Office Action dated Jun. 1, 2016 for Chinese Application No. 201380066338.0, including English translation, 15 pages.
Notification of Reasons for Refusal dated Apr. 14, 2016 in Japanese Application No. 2015-548320.
Second Chinese Office Action for Chinese Application No. 201380066338.0, dated Jan. 16, 2017, including English translation, 18 pages.

* cited by examiner

SENSOR FOR OUTPUTTING AN ELECTRIC SIGNAL ON THE BASIS OF A DETECTED PHYSICAL VARIABLE

CROSS REFERENCE TO RELATED APPLICATIONS

This application is the U.S. National Phase Application of PCT International Application No. PCT/EP2013/075186, filed Nov. 29, 2013, which claims priority to German Patent Application No. 10 2012 224 102.7, filed Dec. 20, 2012, the contents of such applications being incorporated by reference herein.

FIELD OF THE INVENTION

The invention relates to a sensor for outputting an electrical signal on the basis of a detected physical variable, and to a method for producing a sensor for outputting an electrical signal on the basis of a detected physical variable.

BACKGROUND OF THE INVENTION

WO 2010/037810 A1, which is incorporated by reference, discloses a sensor for outputting an electrical signal on the basis of a detected physical variable. The sensor has a measuring circuit which is accommodated in a circuit housing.

SUMMARY OF THE INVENTION

According to one aspect of the invention, a sensor for outputting an electrical signal on the basis of a detected physical variable comprises a measuring circuit which is accommodated in a circuit housing and with which an external circuit can make contact by means of an electrical signal connection, and a protective body which surrounds the circuit housing and is composed of a protective compound and has an opening by means of which a portion of the circuit housing is exposed. In this case, the circuit housing has, on its surface, a shaped element which is surrounded by the protective compound.

The specified sensor is based on the consideration that the protective compound and the circuit housing are subjected to thermal expansion effects on account of which the protective compound of the protective body could become detached from the circuit housing and thereby form a gap between the protective body and the circuit housing. Moisture and other reagents could enter this gap, and said moisture and other reagents could, after a relatively long operating time of the sensor, lead to corrosion or migration of the sensor in the region of the signal connection and thereby accordingly interrupt or short-circuit the signal connection.

This consideration is based on the idea of, for the specified sensor, designing the distance in the gap for the abovementioned moisture and reagents to be as long as possible. To this end, at least one shaped element, which is surrounded by the protective compound of the protective body, can be formed on the surface of the circuit housing. That is to say that the circuit housing and the protective body are intermeshed and thereby lengthen the abovementioned gap. The moisture and the reagents therefore have to cover a longer distance through the gap before reaching the signal connection. In this way, the operating time of the specified sensor until the abovementioned corrosion or migration occurs can be increased, so that a failure rate of the specified sensor can be reduced.

In one development of the specified method, the shaped element runs around the periphery of the circuit housing. This development is based on the consideration that the abovementioned gap is therefore produced only because the circuit housing and the protective body, as already mentioned, expand with different coefficients of expansion. The present development makes use of this fact that the circuit housing and the protective body intermesh on account of the shaped element. That is to say that one of the two meshing partners, the circuit housing or the protective body, has a recess and the correspondingly other of the two meshing partners has a projection which is received in the recess in a substantially interlocking manner. When the protective body has a higher coefficient of expansion than the circuit housing, it will contract in relation to the circuit housing and its meshing partner will radially close the meshing partner on the circuit housing when it is cold. When it is hot, the protective body will expand in relation to the circuit housing and its meshing partner will axially close the meshing partner on the circuit housing. If the shaped element as the meshing partner on the circuit housing therefore runs around the periphery of said circuit housing, the above gap can be reliably closed in the above-described manner irrespective of heat and cold.

Although the shaped element can, in principle, be a depression in the circuit housing, in a particular development of the specified sensor, the shaped element is a rib which, in respect of production, can be attached to the circuit housing in a particularly simple manner and can be encapsulated or cast.

In a preferred development of the specified sensor, the protective compound has a coefficient of expansion which is greater than or equal to a coefficient of expansion of the circuit housing, as a result of which it is possible, in the above-described manner, for the gap between the circuit housing and the protective body to be reliably closed independently of cold or heat.

In a particularly preferred development of the specified sensor, a wall of the shaped element has a pitch angle in relation to the surface of the circuit housing which lies in a range of between 70° and 88°. This pitch angle provides particularly effective sealing of the abovementioned gap irrespective of heat and cold in the described manner.

In another development of the specified sensor, the protective compound can be sprayed or molded around the circuit housing, wherein the shrinkage of said protective compound during curing after spraying or molding is selected to be less than shrinkage during cooling from a working temperature of the sensor to a solidification temperature of the protective compound. This ensures that the protective compound also lies against a portion of the shaped element of the circuit housing during solidification and thereby reliably closes the gap in the above-described manner.

In yet another development of the specified sensor, at least a portion of the surface of the circuit housing is activated in the region of contact with the protective compound. In the text which follows, activation of the surface of the circuit housing is intended to be understood to mean partial destruction of the molecular structure of the surface of the circuit housing, so that free radicals are produced on the surface of the circuit housing. These free radicals are able to form chemical and/or physical bonds to the protective compound, so that said protective compound can no longer become detached from the surface of the circuit housing. The production of the abovementioned gap can be almost completely avoided in this way. If said gap still occurs, the abovementioned measures effectively prevent the abovementioned moisture and reagents reaching the signal connection of the sensor through the gap.

In this case, the protective mass can comprise a polar material, such as polyamide. The polar polyamide can physically bond to the activated surface of the circuit housing in a manner known to a person skilled in the art and in this way close the above gap. Further bonds are possible which, in the molten state of the protective mass, have a polar surface and as a result form a bond with the activated surface of the circuit housing. This bond which is formed is maintained after the molten protective compound solidifies.

In an additional development of the specified sensor, at least a portion of the surface of the circuit housing is roughened in the region of contact with the protective compound, and therefore the effective activated surface is increased in size and the adhesion effect between the circuit housing and the protective compound is improved.

In a particular development of the specified sensor, the roughened portion of the surface of the circuit housing is roughened using a laser. The laser can be used not only to activate the surface of the circuit housing but any mold-release agent which may be present and could suppress adhesion between the circuit housing and the protective compound can also be removed from the surface of the circuit housing by the laser.

However, as an alternative, the laser can also be used only to roughen the surface. In this case, the activation can be carried out, for example, using a plasma.

According to a further aspect of the invention, a method for producing a sensor for outputting an electrical signal on the basis of a detected physical variable comprises the steps of:
accommodating a measuring circuit, with which an external circuit can make contact by means of an electrical signal connection, in a circuit housing,
roughening at least a portion of the surface of the circuit housing, and
accommodating the circuit housing with a protective compound at least in the region of the roughened surface.

Owing to the roughening of the surface, at least small shaped elements are created in the above-described manner, it being possible to delay the ingress of moisture and reagents into the gap by way of said small shaped elements, in order to increase the service life of the produced sensor.

In this case, the roughening particularly preferably takes place by means of a laser.

BRIEF DESCRIPTION OF THE DRAWINGS

The above-described properties, features and advantages of this invention and also the manner in which these are achieved will become clearer and more easily comprehensible in connection with the following description of the exemplary embodiments which will be explained in greater detail in connection with the drawings, in which.

DETAILED DESCRIPTION OF THE PREFERRED EMBODIMENTS

In the figures, identical technical elements are provided with the same reference symbols and described only once.

Figure 1:
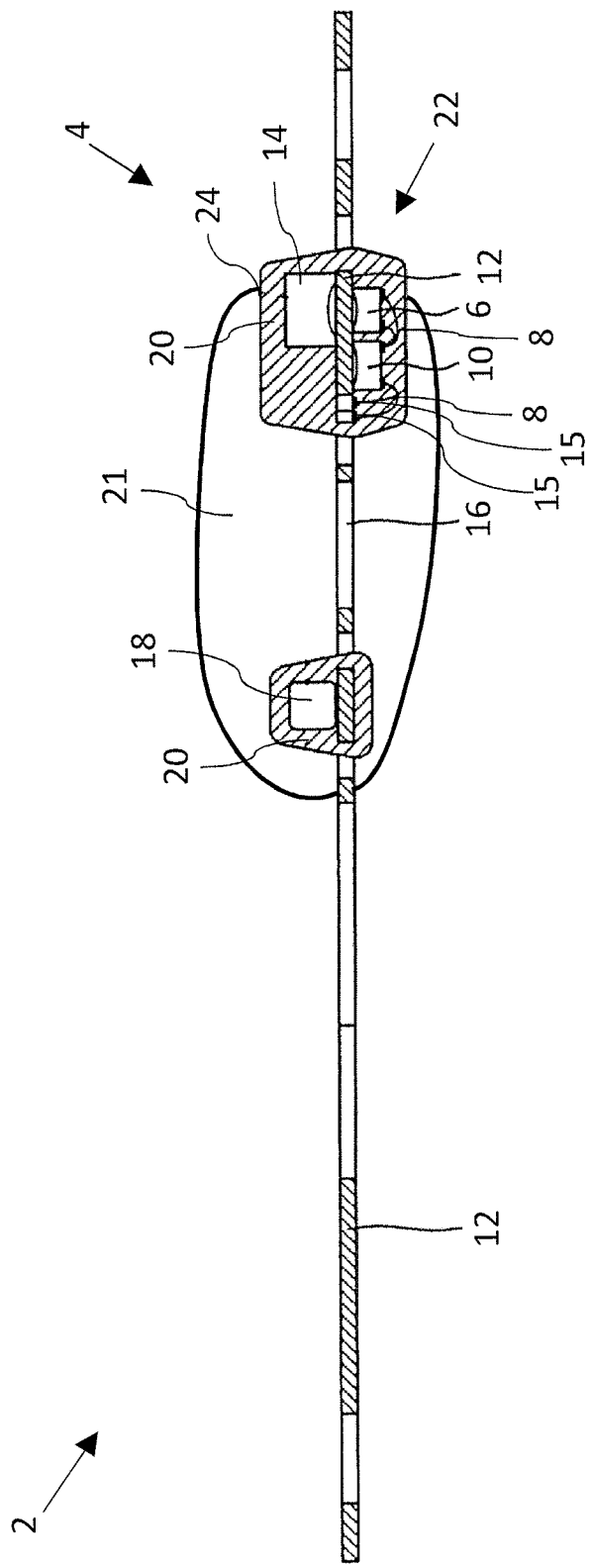
FIG. 1 shows a sectional view through a circuit comprising a sensor.

Reference is made to FIG. 1 which shows a sectional view through a circuit 2 comprising a sensor 4.

In the present embodiment, the sensor 4 is designed as a magnetic field sensor, as is used, for example, in rotation speed sensors for detecting a screened magnetic field. The magnetic field sensor 4 has a measuring pick-up 6, such as a Hall sensor or a magnetoresistive measuring pick-up which is known per se for example, and an evaluation circuit 10 which is connected to the measuring pick-up 6 by means of bonding wires 8. In this case, the measuring pick-up 6 and its evaluation circuit 10 can be combined in a common component. The measuring pick-up 6 and the evaluation circuit 10 are held on a leadframe 12, wherein the leadframe makes electrical contact with the evaluation circuit 10 via bonding wires 8. A magnet 14 can optionally be held on a side of the leadframe 12 which is situated opposite the measuring pick-up 6, said magnet, in a manner which is known to a person skilled in the art, defining an operating point for the measuring pick-up 6 when this is necessary for use as is the case in some magnetoresistive measuring pick-ups.

Measurement signals from the measuring pick-up 6, for example a Hall voltage from a measuring pick-up 6 which is in the form of a Hall sensor, can be transmitted via the bonding wires 8. The measurement signals can be filtered, converted and encoded in the evaluation circuit 10. The measurement signals which are evaluated by the evaluation circuit 10 can then be transmitted to conductor tracks 15 of the leadframe 12 via bonding wires between the evaluation circuit 10 and the leadframe 12, it being possible for said conductor tracks to then forward the evaluated measurement signals, for example, to a motor controller in a vehicle.

The conductor tracks 15 on the leadframe 12 are structured by means of recesses 16 and, in addition to the magnetic field sensor 4, can carry further electrical components, such as a protective capacitor 18 for example, for the magnetic field sensor 4.

The individual electrical components 4, 18 on the leadframe 12 can each be surrounded by a component protective compound 20. This component protective compound 20 serves the electrical individual components 4, 18 in the form of a component protective body which protects against unintentional contact being made with the electrical components 4, 18, for example when mounting said components on the leadframe 12.

In the present embodiment, all of the electrical components 4, 18 are surrounded by a circuit protective compound 21 in order to protect the circuit, which is formed on the basis of the leadframe 12, the conductor tracks 15 and the electrical components 4, 18, against soiling and moisture and to increase the service life of said circuit.

However, in this case, as little circuit protective compound 21 as possible should be used for producing the circuit protective body, and for this reason it would be expedient to not cover a portion of the component protective compound 20 of the electrical components 4, 18 with the circuit protective compound 21.

If, for example, a portion of the component protective compound 20 of the magnetic field sensor 4 is not covered by the circuit protective compound 21, the circuit protective body, which is formed by the circuit protective compound 20, then has an opening 22.

However, this opening 22 can be problematical since the magnetic field sensor 4 is, in principle, subject to fluctuations in temperature which can lead to different thermal expansions of the component protective compound 20 and of the circuit protective compound 21. If the component protective compound 20 comprises, for example, a thermosetting material, such as an epoxy resin for example, and is encased by a thermoplastic as the circuit protective compound 21, such as a polyamide for example, the polyamide then expands more quickly than the epoxy resin on account of a higher coefficient of thermal expansion. In this case, the circuit protective compound 21 can become detached from the component protective compound 20, as a result of which a gap 24 forms between the two elements, it being possible for moisture 26, which is indicated in FIG. 2 for example, to enter said gap.

This is intended to be explained in greater detail with reference to FIG. 2 which shows a schematic view of a portion of the magnetic field sensor 4 from FIG. 1.

Figure 2:
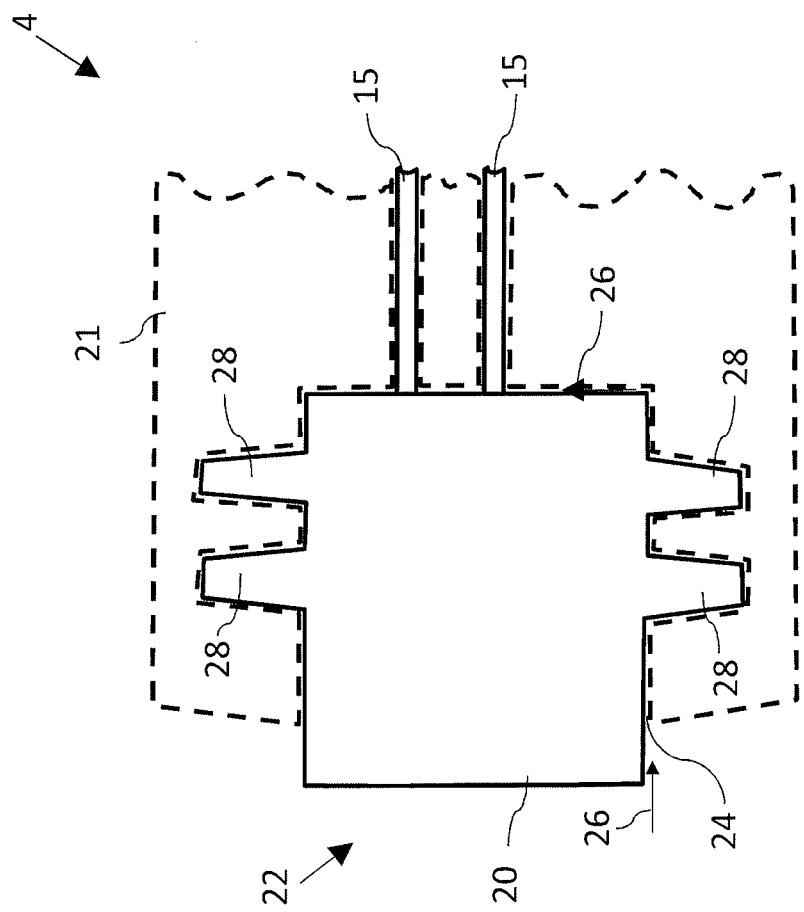
FIG. 2 shows a schematic view of one portion of the sensor from FIG. 1.

The moisture 26 could, as indicated in FIG. 2, move through the gap 24 to the bonding wires 8 and the conductor tracks 15, of which only the conductor tracks 15 are shown in FIG. 2. This moisture could corrode, and in this way interrupt, the bonding wires 8 and the conductor tracks, or migrate and thereby short-circuit said bonding wires and conductor tracks in relation to one another. In both cases, the magnetic field sensor 4 would become non-functional and would fail.

In order to delay the situation of the moisture 26 reaching the bonding wires 8 and the conductor tracks 15 for as long as possible, shaped elements in the form of ribs 28 are formed on the component protective compound 20 in the present embodiment, the moisture 26 in the gap 24 having to flow around said shaped elements. This lengthens the distance through the gap 24 for the moisture 26, this delaying the abovementioned resulting effects of the moisture 26 on the bonding wires 8 and the conductor tracks 15 and it thereby being possible for the magnetic field sensor 4 to remain in operation for a longer period of time.

When the circuit protective compound 21 is applied to the component protective compound 20, the ribs 28 can be encapsulated in a simple manner.

The ribs 28 preferably run around the periphery of the magnetic field sensor 4. The sealing effect provided by the ribs 28 can be further improved in this way, this being explained in greater detail below with reference to FIGS. 3 and 4.

Figure 3:
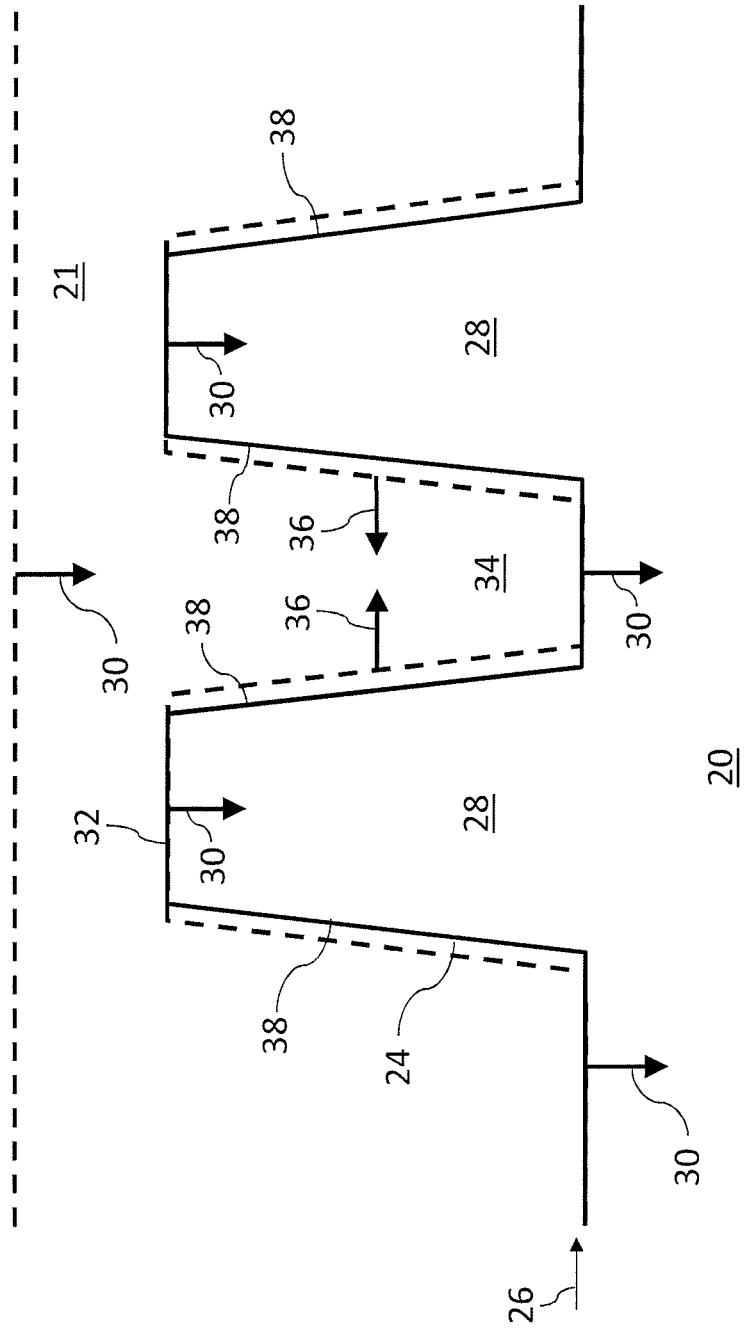
FIG. 3 shows a detail of the sensor from FIG. 2.

The gap 24 between the component protective compound 20 and the circuit protective compound 21 is intended to be described with reference to FIG. 3 when the magnetic field sensor 4 is subjected to a very low temperature which is, for example, considerably lower than an operating temperature of the magnetic field sensor 4.

In the magnetic field sensor 4, the circuit protective compound 21 which forms the circuit protective body shrinks more quickly than the component protective compound 20. That is to say that the circuit protective compound 21 moves toward the component protective compound 20 in a radial direction 30, that is to say it traps the component protective body which is formed by the component protective compound 20. Therefore, the circuit protective compound 21 lies on the radial tips 32 of the ribs 28 and in this way closes the gap 24 at this point. Although a tongue 34 which engages between the ribs 28 and is composed of the circuit protective compound 21 contracts in the axial direction 36 and thus opens the gap 24 at the axial walls 38 of the ribs 28, there is no continuous gap 24 to the conductor tracks 15 and the bonding wires 8, and therefore no moisture 26 can enter there either.

Figure 4:
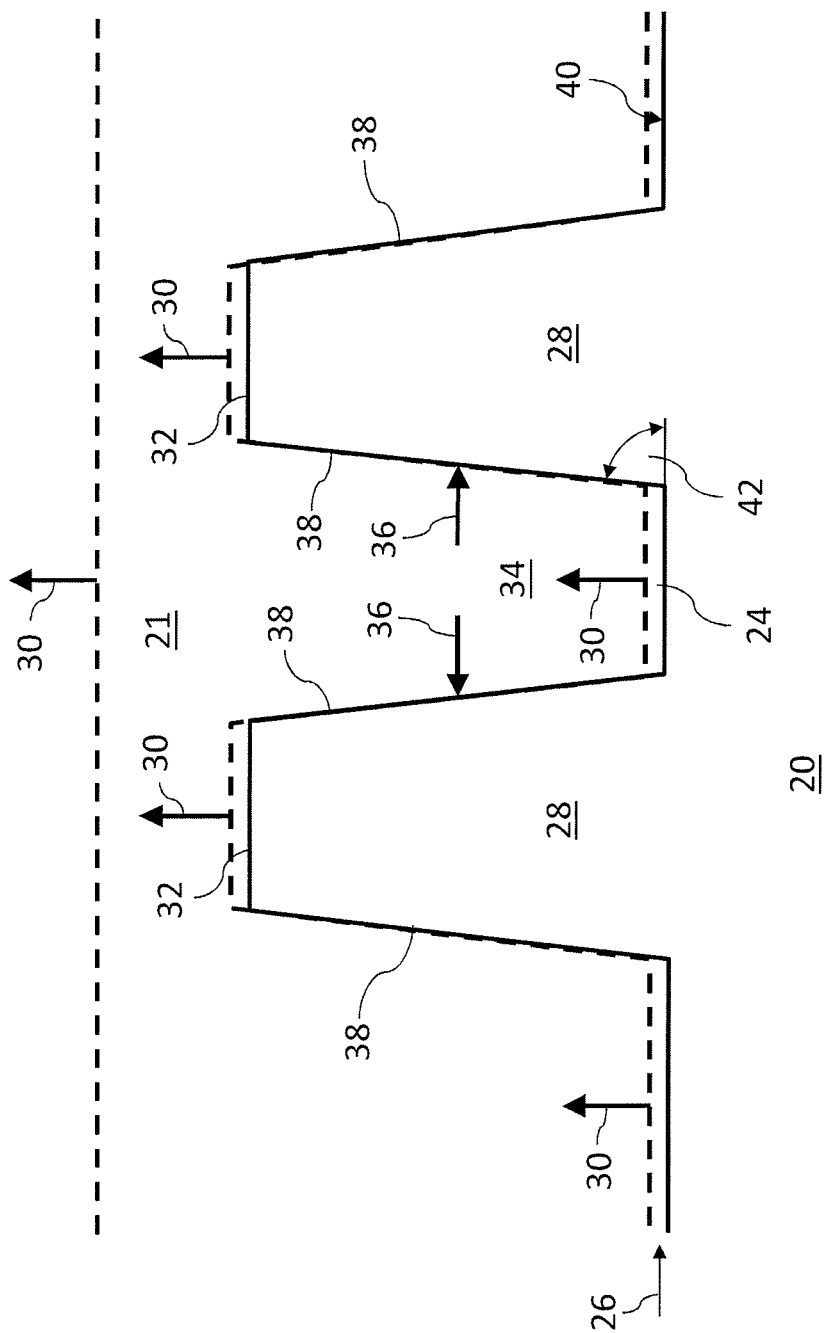
FIG. 4 shows a further detail from the sensor from FIG. 2.

FIG. 4 shows the conditions under which the magnetic field sensor 4 is subjected to a very high temperature which can lie, for example, in the region of the operating temperature of the magnetic field sensor 4.

In this case, although the entire circuit protective compound 21 expands and becomes detached, for example, from the radial tips 32 of the ribs 28 in the radial direction 30, the tongue 34 also expands in the axial direction 36 at the same time and in this way closes the gap 24 at the axial walls 38 of the ribs, and therefore there is no continuous gap 24 as far as the bonding wires 8 in this case either.

In order to achieve a particularly good closure effect of the gap 24 at the axial walls 38 of the ribs 28 in this case, the axial walls 38 should be inclined in relation to a radial surface 40 of the component protective body, which is formed by the component protective compound 20, at a pitch angle 42 of between 70° and 88°.

Further measures can be taken in order to improve the adhesion effect between the circuit protective compound 21 and the component protective compound 20. For example, the entire surface of the component protective body, which is formed by the component protective compound 20, can be activated, as in WO 2010/037810 A1, which is incorporated by reference, and therefore the circuit protective compound 21 which is in the form of polyamide adheres better to the surface of the component protective body which is formed by the component protective compound 20. Details of this can be found in said document.

Furthermore, the surface of the component protective body, which is formed by the component protective compound 20, can be activated using a laser, as a result of which the surface of the component protective body, which is formed by the component protective compound 20, is further increased in size and the adhesion conditions for the circuit protective compound 21 on the component protective body, which is formed by the component protective compound 20, are further improved.

The invention claimed is:

1. A sensor for outputting an electrical signal on the basis of a detected physical variable, comprising:
  a measuring circuit which is accommodated in a circuit housing and with which an external circuit can make contact by an electrical signal connection, and
  a protective body which surrounds the circuit housing and is composed of a protective compound and has an opening by which a portion of the circuit housing is exposed,
  wherein the circuit housing has, on its surface, at least one rib which runs all of the way around a periphery of the circuit housing and is surrounded by the protective compound.

2. The sensor as claimed in claim 1, wherein the protective compound has a coefficient of expansion which is greater than or equal to a coefficient of expansion of the circuit housing.

3. The sensor as claimed in claim 1, wherein a wall of the shaped element has a pitch angle in relation to the surface of the circuit housing in a range of between 70° and 88°.

4. The sensor as claimed in claim 1, wherein the protective compound can be sprayed or molded around the circuit housing, wherein shrinkage of said protective compound during curing after spraying or molding is selected to be less than shrinkage during cooling from a solidification temperature of the protective compound to an operating temperature of the sensor.

5. The sensor as claimed in claim 1, wherein at least a portion of the surface of the circuit housing is activated in the region of contact with the protective compound.

6. The sensor as claimed in claim 1, wherein at least a portion of the surface of the circuit housing is roughened in the region of contact with the protective compound.

7. The sensor as claimed in claim 6, wherein the roughened portion of the surface of the circuit housing is roughened using a laser.

8. A method for producing a sensor for outputting an electrical signal on the basis of a detected physical variable, comprising:
  accommodating a measuring circuit, with which an external circuit can make contact by an electrical signal connection, in a circuit housing having, on its surface, at least one rib which runs all of the way around a periphery of the circuit housing,
  roughening at least a portion of the surface of the circuit housing using a laser and
  accommodating the circuit housing with a protective compound at least in a region of the roughened surface such that the at least one rib on the surface of the circuit housing is surrounded by the protective compound.

* * * * *